United States Patent [19]

Bartko et al.

[11] 4,311,534

[45] Jan. 19, 1982

[54] REDUCING THE REVERSE RECOVERY CHARGE OF THYRISTORS BY NUCLEAR IRRADIATION

[75] Inventors: John Bartko, Monroeville; Krishan S. Tarneja; Chang K. Chu, both of Pittsburgh; Earl S. Schlegel, Plum Borough, all of Pa.

[73] Assignee: Westinghouse Electric Corp., Pittsburgh, Pa.

[21] Appl. No.: 163,548

[22] Filed: Jun. 27, 1980

[51] Int. Cl.³ .............. H01L 21/263; H01L 29/167; H01L 7/54
[52] U.S. Cl. ............................. 148/1.5; 148/187; 357/39; 357/91; 427/43.1
[58] Field of Search ............... 148/1.5, 187; 427/43.1; 357/39, 91

[56] References Cited

U.S. PATENT DOCUMENTS

| | | | |
|---|---|---|---|
| 4,056,408 | 11/1977 | Bartko et al. | 148/1.5 |
| 4,075,037 | 2/1978 | Tarneja et al. | 148/1.5 |
| 4,134,778 | 1/1979 | Sheng et al. | 357/39 |
| 4,137,099 | 1/1980 | Sun | 148/1.5 |
| 4,224,083 | 9/1980 | Cressnell | 148/1.5 |
| 4,240,844 | 12/1980 | Felice et al. | 148/1.5 |
| 4,259,683 | 3/1981 | Adler et al. | 357/91 |

*Primary Examiner*—Upendra Roy
*Attorney, Agent, or Firm*—C. L. Menzemer

[57] ABSTRACT

A method of reducing the reverse recovery charge of thyristors without substantially increasing forward voltage drop by first determining the depth of the anode PN junction from a major surface adjoining a cathode emitter region. The depth of maximum defect generation in thyristor on irradiation through the major surface with a given radiation source radiating particles with molecular weight greater than one, preferably proton or alpha particles, and adjusting the energy level at the major surface of the thyristor from the radiation source to provide the depth of maximum defect generation adjacent the anode PN junction and preferably in the anode base region within 20 micrometers of the anode PN junction or in the anode emitter region within 15 micrometers of the anode PN junction. Thereafter the thyristor is irradiated through said major surface with the adjusted energy level from the radiation source to a given dosage to reduce the reverse recovery stored charge of the thyristor without substantially increasing the forward voltage drop.

6 Claims, 6 Drawing Figures

REDUCING THE REVERSE RECOVERY CHARGE OF THYRISTORS BY NUCLEAR IRRADIATION

BACKGROUND OF THE INVENTION

1. Field of the Invention

The present invention relates to the manufacture of semiconductor devices and particularly thyristors.

This application is considered an improvement on the method described and claimed in U.S. Pat. No. 4,075,037, granted Feb. 21, 1978 and assigned to the same assignee as the present application.

It has recently been demonstrated to irradiate semiconductor devices to modify the electrical characteristics in various ways. See, e.g., U.S. Pat. Nos. 3,809,582; 3,840,887; 3,852,612; 3,872,493; 3,877,977; 3,881,963; 3,881,964; 3,990,091; 4,040,170; 4,056,408; 4,075,037; 4,076,555 and U.S. Pat. application Ser. Nos. 929,624 filed July 31, 1978 now U.S. Pat. No. 4,224,083; 972,302 filed Dec. 22, 1978 now U.S. Pat. No. 4,240,844 and 000,936 (filed Jan. 4, 1979), all of which are assigned to the same assignee as the present application.

Certain semiconductor devices must be switched from a high current forward conducting mode to a high voltage reverse blocking mode during their operation. The most common of these is thyristors. More complex semiconductor devices containing a thyristor component include diacs, triacs, reverse switching rectifiers and reverse conducting thyristors.

When a thyristor and particularly a power thyristor is in the forward conducting state excess carrier concentrations and corresponding excess charge are present in the base regions, and particularly the anode base region which generally has a lower impurity concentration than the cathode base region. During reverse recovery of the thyristor, the excess charge called the reverse recovery charge (Qrr) must be removed by carrier recombination and diffusion, limiting the reverse blocking characteristics of the thyristor. The amount of the reverse recovery charge is a function of the devices' parameters, most notably, the minority carrier lifetime in the base regions and the current gain across the anode base region.

For many thyristor applications it is desirable to have the reverse recovery charge (Qrr) as low as possible or tailored to a particular value. In U.S. Pat. No. 4,075,037, it is proposed to reduce the excess charge by reducing the minority carrier lifetime in the base regions and particularly in the cathode base region by irradiating the device preferably with electron radiation. Although this method has been successful, the dosage must be carefully controlled with this technique because the reduction in minority carrier lifetime and reduction in excess charge is accompanied by an increase in forward voltage drop ($V_{TM}$) and leakage current. A trade off must be effected particularly between reduction in excess charge and an increase in forward voltage drop.

The present invention overcomes these difficulties and provides a method of reducing the reverse recovery charge (Qrr) of a thyristor with minimal changes in forward voltage drop ($V_{TM}$) and leakage current.

In U.S. Pat. No. 4,056,408, a method is described and claimed for reducing the switching time of semiconductor devices, including thyristors, by irradiating with nuclear radiation and preferably protons or alpha particles. The energy level from the radiation source is adjusted to provide defect generation adjacent a blocking PN junction. It teaches, contrary to the present invention, that the maximum defect generation should be adjacent the blocking PN junction, between the cathode base and anode base regions.

SUMMARY OF THE INVENTION

A method is provided for reducing the reverse recovery charge of thyristors without perceptibly affecting other electrical characteristics and particularly the forward voltage drop and leakage current of the thyristors. The switching time (tq) is also reduced somewhat in the usual devices.

The method comprises the steps of determining the depth of an anode PN junction from a major surface adjoining a cathode-emitter region of a thyristor. The depth of maximum defect generation in the thyristor from the major surface is then determined utilizing a given, preferably monoenergetic, radiation source radiating particles with a molecular weight of at least one. Preferably, such nuclear radiation source is a proton or alpha particle radiation source because such radiation sources can be produced relatively inexpensively and are substantially chemically and electrically inactive on irradiation into silicon semiconductor bodies as explained in more detail hereafter. There are certain embodiments where higher molecular weight particles, such as nitrogen ions, may be more desirable because of the need for defect generation distributions with narrower half-width, i.e., the width of the distribution curve at one-half the maximum defect generation. See FIG. 1 in U.S. Pat. No. 4,056,408 for a better understanding of "half-width."

The energy level at the major surface of the thyristor from the radiation source is then adjusted to provide the depth of maximum defect generation adjacent the anode PN junction, but preferably it is in the anode base region adjacent the anode junction. The maximum defect generation is preferably within 20 micrometers in the anode base region or 10 to 15 micrometers from the anode junction in the anode emitter region. The positioning of the maximum defect generation can be readily located because the range of such nuclear particles is easily determined knowing the semiconductor material and the energy level. The maximum defect generation occurs near the end of the range of penetration of the radiation into the semiconductor material.

At least one and preferably a plurality of thyristors are then positioned with the major surface of them to be exposed to the radiation source with the energy level adjusted at the major surface. The thyristors then irradiated with the adjusted radiation source to a dosage level reducing the reverse recovery charge of the thyristor without significantly affecting the forward voltage drop and leakage current.

Other details, objects and advantages of the invention will become apparent as the following description of the presently preferred embodiments and presently preferred methods of practicing the same proceeds.

BRIEF DESCRIPTION OF THE DRAWINGS

In the accompanying drawings the preferred embodiments of the invention and preferred methods of practicing the invention are illustrated in which.

DESCRIPTION OF THE PREFERRED EMBODIMENTS

Figure 1:
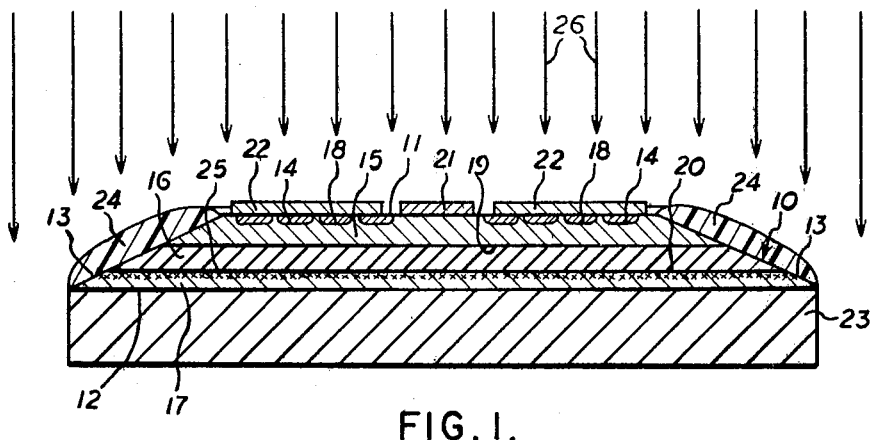
FIG. 1 is an elevational view in cross section of a center-fired thyristor being irradiated in accordance with the present invention.

Referring to FIG. 1, center-fired thyristor semiconductor body 10 being irradiated in accordance with the present invention has opposed major surfaces 11 and 12 and curvilinear side surfaces 13. The thyristor body 10 has cathode emitter region 14 and anode emitter region 17 of impurities of opposite conductivity type adjoining major surfaces 11 and 12, respectively, and cathode base region 15 and anode base region 16 of impurities of opposite conductivity type in the interior of body 10 between emitter regions 14 and 17. Also cathode emitter region 14 and cathode base region 15 are impurities of opposite conductivity type, and anode base region 16 and anode emitter region 17 are impurities of opposite conductivity type. Preferably, cathode base and anode emitter regions 15 and 17 are simultaneously formed by diffusion of, for example, gallium and/or aluminum through major surfaces 11 and 12 by standard techniques, typically to a surface concentration between $1 \times 10^{17}$ and $1 \times 10^{19}$ atoms/cm$^3$. Cathode emitter region 14 is thereafter formed by selective diffusion of, for example, phosphorous through major surface 11 by standard techniques. By this arrangement, thyristor body 10 is provided with a four-layer inpurity structure in which three PN junctions 18, 19 and 20 are formed: Cathode PN junction 18, blocking PN junction 19 and anode PN junction 20.

The thyristor is provided with a center-fired gate by adjoining cathode base region 15 to major surface 11 at center portions of body 10. Cathode base region 15 also adjoins major surface 11 intermittently of cathode emitter region 14 to form shunts conventional in high power thyristors. To provide electrical contact to thyristor body 10, metal electrodes 21 and 22 make ohmic contact to cathode base region 11 and cathode emitter region 14, respectively, at major surface 11. Preferably, gate electrode 21 and cathode electrode 22, typically of about 40,000 Angstroms in thickness, are deposited by selective metallization of a suitable metal such as aluminum, or alternatively, indiscriminate metallization of such a metal followed by selective removal of the deposited metal by standard photolithographic and etch techniques. Supporting metal electrode 23 makes ohmic contact to anode emitter region 17 at major surface 12 preferably by alloying electrode 23 of a suitable metal such as molybdenum, of 80 mils in thickness, to body 10. Atmospheric effects on the thyristor operation are substantially reduced by coating side surfaces 13 with a suitable passivating resin 24 such as a silicone, epoxy or varnish composition.

To implement the present invention, the depth of anode PN junction 20 into semiconductor body 10 from major surface 11 is determined using techniques which are well known.

For irradiation, a suitable radiation source is selected which emits nuclear particles of a molecular weight of at least one. Preferably, the radiation source emits protons, alpha particles or nitrogen ions because such particles are essentially electrically and chemically inactive or irradiation into the semiconductor body. In this regard, a second level or preference is expressed for beryllium ions. Other nuclear particles having a molecular weight of at least 1 may be utilized; however nuclear particles having a molecular weight higher than 16 are presently impractical because available radiation sources, e.g., Van de Graaff accelerators, do not generate high enough energy to cause penetration of such higher molecular weight particles into the semiconductor body to the desired depth as hereinafter described. Additionally, nuclear particles such as boron ions, carbon ions and oxygen ions should not be utilized because of their electrical and chemical activity on penetration into the semiconductor body. For these reasons, proton and alpha radiation are generally most desired, although higher molecular weight particles such as nitrogen ions may be more useful in certain applications where a narrower half-width is desired for the defect generation distribution.

Additionally, the radiation source is preferably an essentially monoenergetic source, such as a Van de Graaff accelerator, to obtain the narrowest half-width for the defect generation distribution. With certain radiation sources, it may be appropriate to sacrifice monoenergetics to some degree to utilize a scattering foil to provide a more uniform particle distribution over the surface of the device, where the radiation beam cannot be modulated horizontally and vertically to achieve uniform particle distribution. Generally, the monoenergetics of the radiation source is, however, achieved to the extent possible to provide the narrowest half-width for the defect generation distribution and in turn lowest reverse recovery charge while maintaining a low forward voltage drop.

Figure 4:
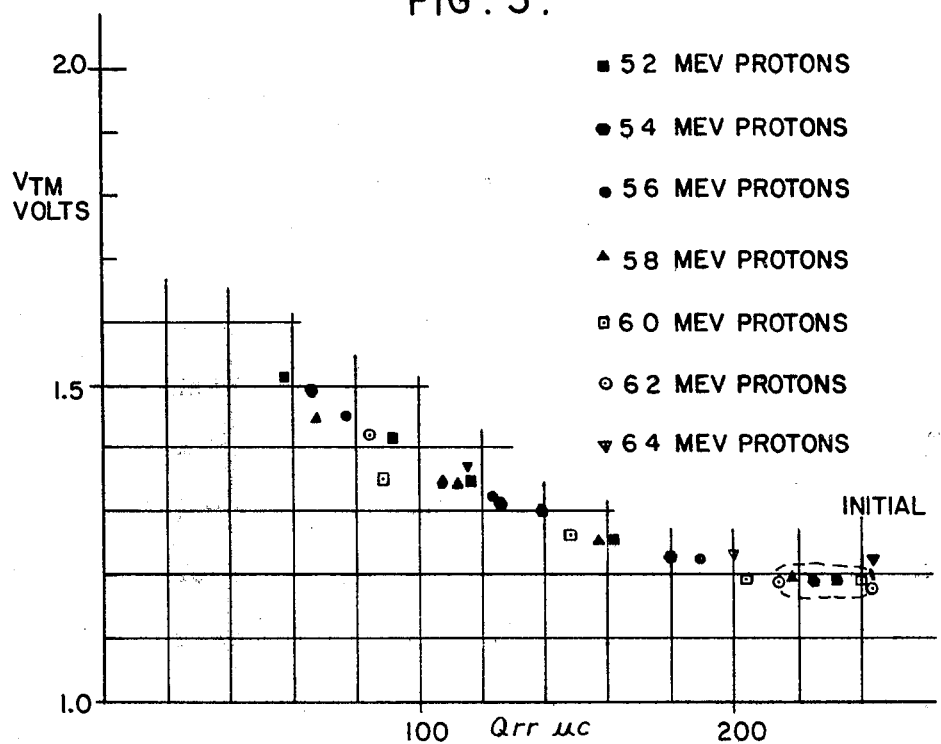
FIG. 4 is a graph showing the relationship between reverse recovery charge (Qrr) and forward voltage drop ($V_{TM}$) on irradiation of thyristors with protons of different energy levels.
Figure 5:
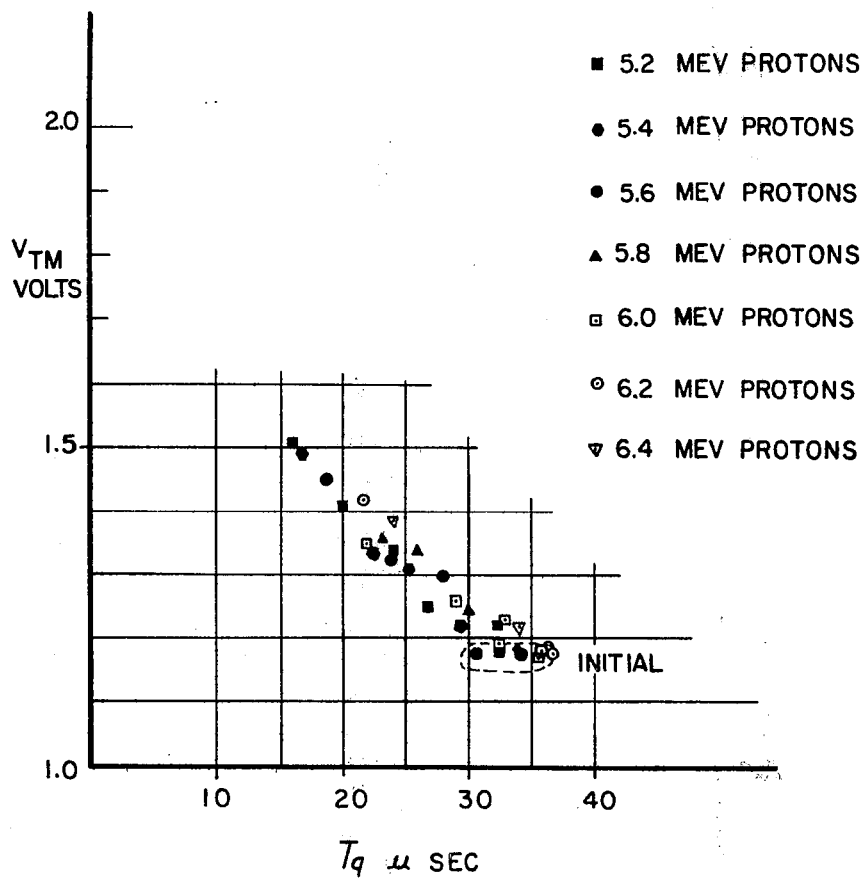
FIG. 5 is a graph showing the relationship between switching time (tq) and forward voltage drop ($V_{TM}$) on irradiation the same of thyristors measured in connection with FIG. 4.
Figure 6:
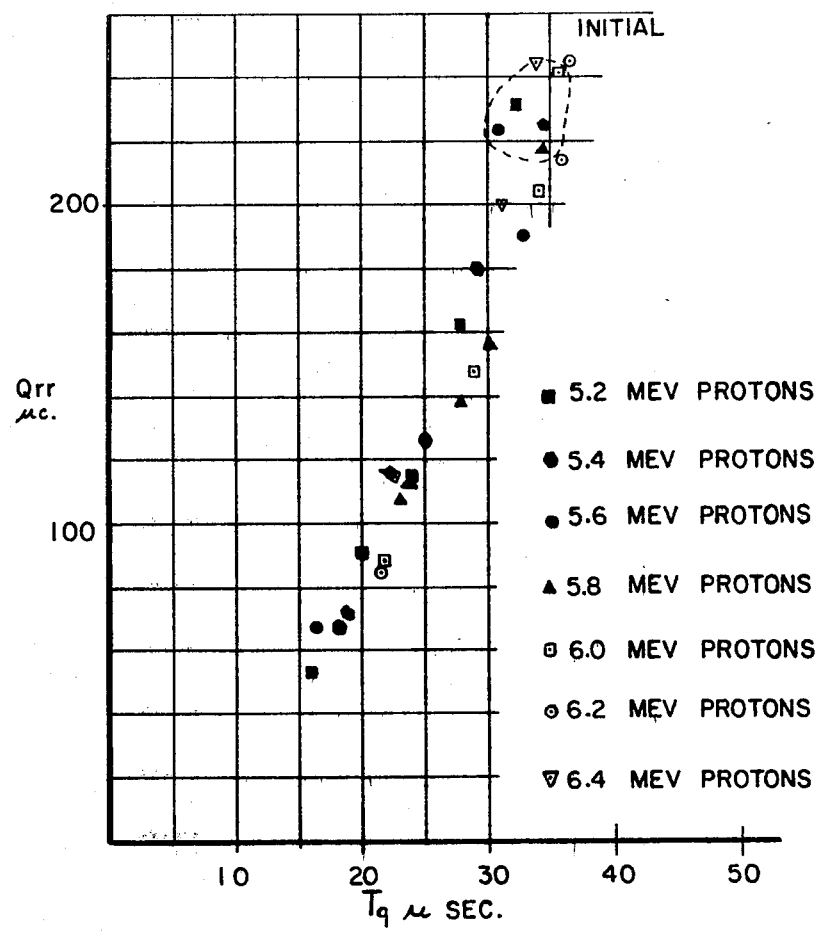
FIG. 6 is a graph showing the relationship between switching time (tq) and reverse recovery charge (Qrr) on irradiation of the same thyristors measured in connection with FIG. 4.

On selection of a radiation source, the energy level is again adjusted to provide the depth of maximum defect generation adjacent anode PN junction 60 of the thyristor. The energy level is adjusted by experimentally selecting an energy range from a graph such as that shown in FIG. 10 of U.S. Pat. No. 4,056,408, and thereafter radiating various thyristor bodies of the particular type of thyristor to be irradiated with different energy levels within the selected energy range and measuring the electrical characteristics and particularly the turn-off time, forward voltage drop and leakage current. The optimum energy level can be selected by plotting the relationships between the measured electrical characteristics as shown in FIGS. 4, 5 and 6, or by processing the measured data by digital computer. The energy level is preferably adjusted by controlling the energy level of the radiation source.

Radiation is performed on the thyristor by positioning major surface 11 of body 10 for exposure to the selected nuclear radiation source, such as a Van de Graaff accelerator. By this arrangement, thyristor body 10 is positioned to be irradiated through major surface 11 adjoining cathode emitter region with radiation 26 at the adjusted energy level from the selected radiation source. Thyristors are thereafter irradiated by radiation 26 with the adjusted energy level from the selected radiation source to a dosage level sufficient to reduce the reverse recovery charge of the thyristor to a desired level. The optimum dosage level is also selected experimentally along with the optimum energy level by irradiating groups of thyristors of the same type as shown to various dosage levels, and graphically plotting the relationships between forward voltage drop, reverse recovery charge and switching time as shown in FIGS. 4, 5 and 6. Alternatively, the measured data may be processed by digital computer to select the desired dosage level. Additionally, leakage current may be plotted as part of the relationships to optimize this electrical characteristic.

In any case, the maximum defect generation is provided generally at dotted line 25 as shown in FIG. 1 in anode emitter region 17 adjacent anode PN junction 20. That is, the maximum defect generation is in the anode emitter region 17 less than a fourth the width of region 17 from anode junction 20 to major surface 12 and preferably is within 10 to 15 micrometers of the anode junction in power thyristors. The maximum defect generation is, however, spaced from the anode junction to reduce leakage current. As explained in detail hereafter, such positioning reduces the reverse recovery charge of the thyristor with minimal increase of forward voltage drop and leakage current.

Figure 2:
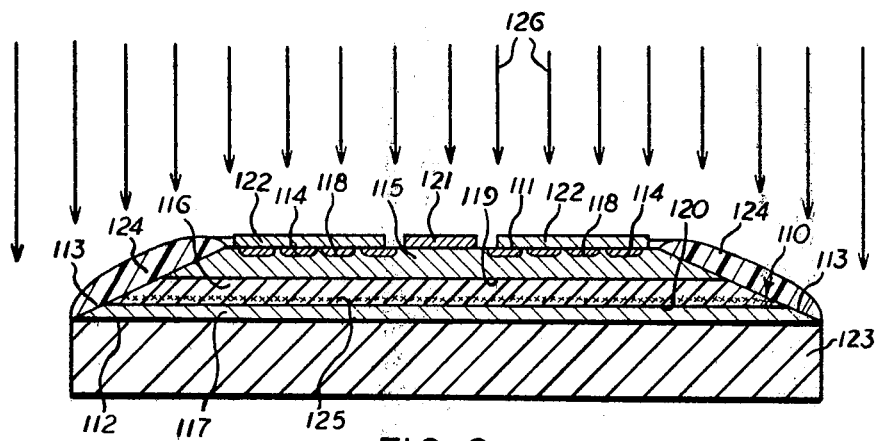
FIG. 2 is an elevational view in cross section of a center-fired thyristor being alternatively irradiated in accordance with the present invention.

Referring to FIG. 2, a center-fired thyristor similar to that described in connection with FIG. 1 is irradiated in accordance with the present invention to reduce reverse recovery charge. The thyristor has the elements and the relation between them the same as described in connection with FIG. 1. Therefore, elements have been correspondingly numbered with a prefix "1".

The only difference is the position of the maximum defect generation 126. In FIG. 2, the maximum defect generation 126 is positioned in the anode base region 116 adjacent anode junction 120. That is, the maximum defect generation is in anode base region 117 less than a fourth the width of the anode base region between blocking junction 119 and anode junction 120, and preferably in power thyristors within 20 micrometers of anode junction 120. Again, the maximum defect generation is spaced from the anode junction 120 to avoid increases in leakage current.

Hence, as shown in FIGS. 1 and 2 the maximum defect generation is positioned adjacent the anode junction between one-fourth the width of the anode emitter region and one-fourth the width of the anode base region, and preferably from within 20 micrometers in the anode base region to within 10 to 15 micrometers in the anode emitter region. More preferably, however, the maximum defect generation is positioned in the anode base region spaced from the anode junction because it has been found that a higher dosage, as well as a higher energy, is required to provide the defect generation in the anode emitter region having the high impurity concentration.

Figure 3:
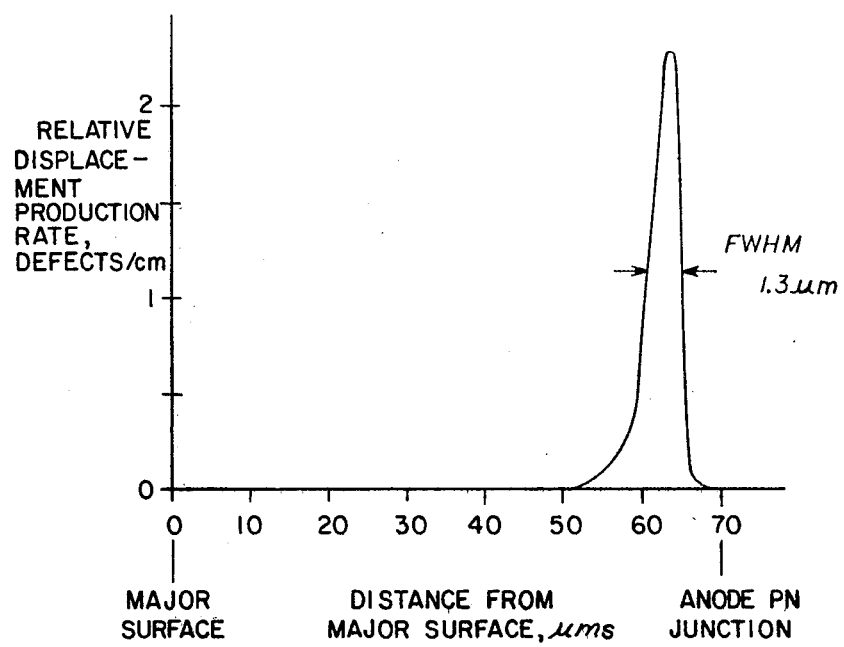
FIG. 3 is a graph illustrating the spatial distribution of radiation defects in the thyristor as shown in FIG. 2 on irradiation with alpha particles.

A preferred positioning of the maximum defect generation in a typical power thyristor is shown in FIG. 3 using 10.2 Mev monoenergetic alpha particles from a Van der Graaff generator as the adjusted radiation source. As shown the maximum defect generation is positioned about 61 micrometers into the semiconductor device from the major surface through which the radiation enters and about 9 micrometers from the anode junction in the anode base region. The half-width of the radiation defect is about 1.3 micrometers.

To illustrate the operation of the invention as shown in FIGS. 2 and 3 two groups of twenty (20) T62 NBH power thyristors were irradiated as shown using 10.2 Mev monoenergetic alpha particles from a Van de Graaff generator. Each group was indicated as shown to a dosage of $3.72 \times 10^{10}$ alpha particles per square centimeter. One of the groups, designated "Group 2," was then irradiated in addition with 17 Mev alpha particles from the Van der Graaff generator to a dosage of $1.24 \times 10^{10}$ alpha particles per square centimeter. The purpose of the second dose was to determine what effect 17 Mev alpha particle defect generation had on reverse recovery charge.

The reverse recovery charge of each thyristor was measured before and after irradiation in microcoulombs. The average values of Qrr for each group before and after irradiation with the percentage reduction in reverse recovery time is given in Table 1.

TABLE 1

|  | Initial $Q_{rr}$, uC (Unirradiated) | Final $Q_{rr}$, uC (Irradiated) | Percentage Decrease |
|---|---|---|---|
| Group 1 | 105 | 55 | 44 |
| Group 2 | 132 | 50 | 62 |

As shown in Table 1, the reverse recovery charge was reduced considerably by both irradiations. Moreover, the forward voltage drop ($V_{TM}$) and leakage current changes for these energies and dosages were found to be minimal.

To further illustrate the invention, T72 NCB power thyristors were irradiated with proton particles from a Van de Graaff generator. The irradiations were performed at different energy levels through an 11-micrometer aluminum scattering foil. The difference in energy levels was selected to vary the position of maximum defect generation adjacent the anode junction in the anode base and anode emitter regions.

Seven groups of the power thyristors were provided with 5 to 10 devices in each group. The anode junction in each thyristor was determined within production limits to be at 236 micrometers. The groups were irradiated with 5.2, 5.4, 5.6, 5.8, 6.0, 6.2 and 6.4 Mev protons through the scattering foil. The 5.8 Mev were calculated to position the maximum defect generation at the anode junction, and the other energies to position the maximum defect generation on opposite sides of the anode junction in 15 micrometer increments.

The reverse recovery charge (Qrr) switching time (tq) and forward voltage drop ($V_{TM}$) of the devices were measured before irradiation and after various incremental dosages during the irradiation. The average measurements were then plotted as shown in FIGS. 4, 5 and 6 to determine the relationship of forward voltage drop ($V_{TM}$) to reverse recovery charge (Qrr), of switching time (tq) to reverse recovery charge (Qrr) and of forward voltage drop ($V_{TM}$) to switching time (tq).

As shown in FIG. 4, the reverse recovery time was reduced dramatically in every instance with only minimal increase in forward voltage drop. Furthermore, as shown in FIG. 4, the positioning of the maximum defect generation adjacent the anode junction either in the anode base region or anode emitter region caused little relative change in the electrical characteristics. Slightly better characteristics were achieved with the 6.0 Mev energy level which places the maximum defect generation in the anode emitter about 15 micrometers from the anode junction. However, FIG. 4 shows that a greater change in reverse recovery charge can be achieved with lesser dosage by positioning the maximum defect generation in the anode base region, which makes this embodiment more practical.

Referring to FIGS. 5 and 6, all other things being equal, the energy level could also be selected to optimize the relation between switching time (tq) and forward voltage drop ($V_{TM}$) or between switching time (tq) and reverse recovery time (Qrr). However, here again there was little difference, with the 6.0 Mev energy level again being only slightly better.

As shown by FIG. 6 the switching time was also decreased somewhat by the irradiation but not in any substantial way. The decrease was approximately one-half over the entire dosage. This is believed to be because the irradiation changes the current gain across the anode base region very considerably without substantially altering the carrier lifetime in the cathode base region.

While presently preferred embodiments have been shown and described with particularity, it is distinctly understood that the invention may be otherwise variously embodied and used within the scope of the following claims.

What is claimed is:

1. A method of reducing the reverse recovery charge of thyristors without substantially increasing forward voltage drop comprising the steps of:
   (A) determining the depth of an anode PN junction from a major surface adjoining a cathode-emitter region of a thyristor;
   (B) determining the depth of maximum defect generation in the thyristor on irradiation through said major surface with a given radiation source radiating particles with molecular weight of at least one;
   (C) adjusting the energy level at said major surface of the thyristor from said radiation source to provide the depth of maximum defect generation adjacent the anode PN junction of the thyristor;
   (D) thereafter irradiating the thyristor through said major surface with said energy level from said radiation source to a given dosage to reduce the reverse recovery charge of the thyristor.

2. A method of reducing the reverse recovery stored charge of a thyristor as claimed in claim 1 wherein:
   the depth of maximum defect generation is in an anode base region within 20 micrometers of the anode PN junction.

3. A method of reducing the reverse recovery stored charge of a thyristor as claimed in claim 1 wherein:
   the depth of maximum defect generation is in an anode emitter region within 15 micrometers of the anode PN junction.

4. A method of reducing the reverse recovery charge of thyristors without substantially increasing toward voltage drop comprising the steps of:
   (A) determining the depth of anode PN junction from a major surface adjoining a cathode-emitter region of a thyristor;
   (B) determining the depth of maximum defect generation in the thyristor on irradiation through said major surface with a given radiation source radiating particles taken from the group of proton or alpha particles;
   (C) adjusting the energy level from said radiation source to provide the depth of maximum defect generation adjacent the anode PN junction of the thyristor;
   (D) thereafter irradiating the thyristor through said major surface with said energy level from said radiation source to a given dosage to reduce the reverse recovery stored charge of the thyristor.

5. A method of reducing the reverse recovery stored charge of a thyristor as claimed in claim 4 wherein:
   the depth of maximum defect generation is in an anode base region within 20 micrometers of the anode PN junction.

6. A method of reducing the reverse recovery stored charge of a thyristor as claimed in claim 4 wherein:
   the depth of maximum defect generation is in an anode emitter region within 15 micrometers of the anode PN junction.

* * * * *